(12) United States Patent
Lindner et al.

(10) Patent No.: US 11,472,212 B2
(45) Date of Patent: Oct. 18, 2022

(54) DEVICE AND METHOD FOR EMBOSSING MICRO- AND/OR NANOSTRUCTURES

(71) Applicant: EV Group E. Thallner GmbH, St. Florian am Inn (AT)

(72) Inventors: Friedrich Paul Lindner, St. Florian am Inn (AT); Harald Zaglmayr, Leonding (AT); Christian Schon, Andorf (AT); Thomas Glinsner, St. Florian am Inn (AT); Evelyn Reisinger, Diersbach (AT); Peter Fischer, Taufkirchen an der Pram (AT); Othmar Luksch, St. Florian am Inn (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 317 days.

(21) Appl. No.: 16/325,918

(22) PCT Filed: Sep. 5, 2016

(86) PCT No.: PCT/EP2016/070837
§ 371 (c)(1),
(2) Date: Feb. 15, 2019

(87) PCT Pub. No.: WO2018/041371
PCT Pub. Date: Mar. 8, 2018

(65) Prior Publication Data
US 2019/0176500 A1    Jun. 13, 2019

(51) Int. Cl.
*B41K 1/22* (2006.01)
*G03F 7/00* (2006.01)
*B41K 3/14* (2006.01)
*B41F 19/02* (2006.01)

(52) U.S. Cl.
CPC ............. *B41K 1/22* (2013.01); *B41F 19/02* (2013.01); *B41K 3/14* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 8,763,239 B2 | 7/2014 | Lindner et al. |
| 9,415,537 B2 | 8/2016 | Itani et al. |
| 10,005,225 B2 | 6/2018 | Fischer et al. |
| 10,414,087 B2 | 9/2019 | Fischer et al. |
| 2009/0045539 A1 | 2/2009 | Yoneda |
| 2009/0174118 A1 | 7/2009 | Maeda et al. |
| 2010/0166906 A1 | 7/2010 | Hashimoto et al. |
| 2010/0303947 A1 | 12/2010 | Mori et al. |
| 2011/0266709 A1 | 11/2011 | Song et al. |

(Continued)

FOREIGN PATENT DOCUMENTS

| | | |
|---|---|---|
| CN | 106663603 A | 5/2017 |
| EP | 2 058 107 A1 | 5/2009 |

(Continued)

OTHER PUBLICATIONS

International Search Report and Written Opinion from corresponding International Patent Application No. PCT/EP2016/070837, dated May 29, 2017.

(Continued)

*Primary Examiner* — Joshua D Zimmerman
(74) *Attorney, Agent, or Firm* — Kusner & Jaffe

(57) ABSTRACT

An apparatus and a method for embossing micro- and/or nanostructures in an embossing material.

44 Claims, 5 Drawing Sheets

(56) References Cited

U.S. PATENT DOCUMENTS

| | | |
|---|---|---|
| 2013/0323347 A1 | 12/2013 | Itani et al. |
| 2014/0346713 A1 | 11/2014 | Wada |
| 2015/0314323 A1 | 11/2015 | Park et al. |
| 2016/0031151 A1 | 2/2016 | Tan et al. |
| 2017/0205708 A1 | 7/2017 | Miyazawa |
| 2019/0351606 A1 | 11/2019 | Fischer et al. |

FOREIGN PATENT DOCUMENTS

| | | |
|---|---|---|
| EP | 3 171 391 A1 | 5/2017 |
| JP | 2010-280065 A | 12/2010 |
| JP | 2011-187649 A | 9/2011 |
| JP | 2012-081618 A | 4/2012 |
| JP | 5088369 B2 | 9/2012 |
| JP | 2014-054735 A | 3/2014 |
| JP | 5559574 B2 | 7/2014 |
| JP | 2014-226877 A | 12/2014 |
| JP | 2015-027798 A | 2/2015 |
| JP | 2015-119104 A | 6/2015 |
| JP | 2015-534721 A | 12/2015 |
| JP | 2016-082204 A | 5/2016 |
| KR | 2016-0095232 A | 8/2016 |
| KR | 10-2017-0031710 A | 3/2017 |
| TW | 201410492 A | 3/2014 |
| TW | 201505812 A | 2/2015 |
| TW | 201616553 A | 5/2016 |
| WO | WO 2008/142958 A1 | 11/2008 |
| WO | WO-2014/037044 A1 | 3/2014 |
| WO | WO-2015/012161 A1 | 1/2015 |
| WO | WO-2016/010105 A1 | 1/2016 |
| WO | WO-2016/045961 A1 | 3/2016 |

OTHER PUBLICATIONS

Preliminary Examination Report from corresponding International Patent Application No. PCT/EP2016/070837 dated Nov. 29, 2018.
Office Action issued in related Japanese Patent Application No. 2021-151847 dated Jul. 5, 2022.

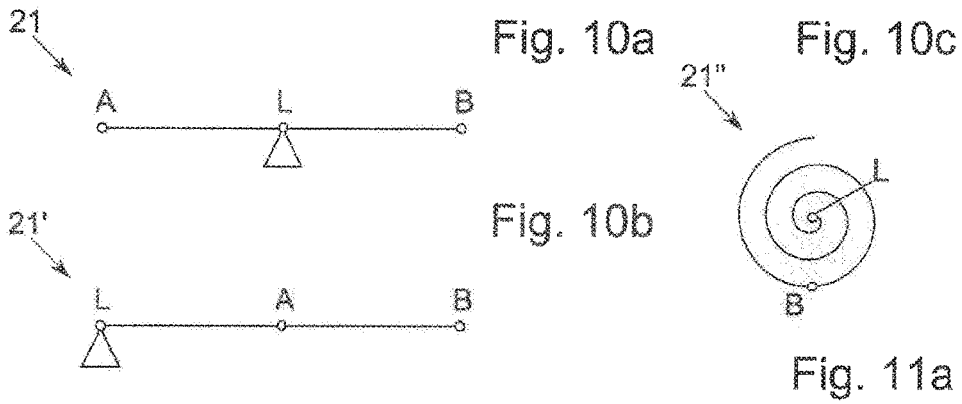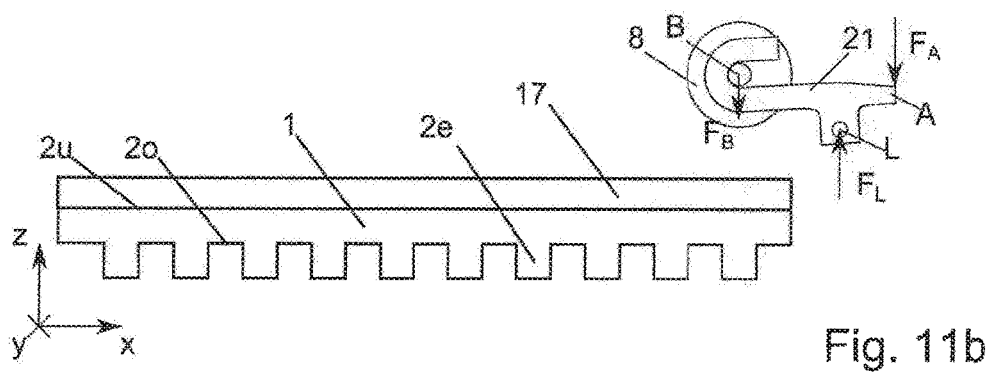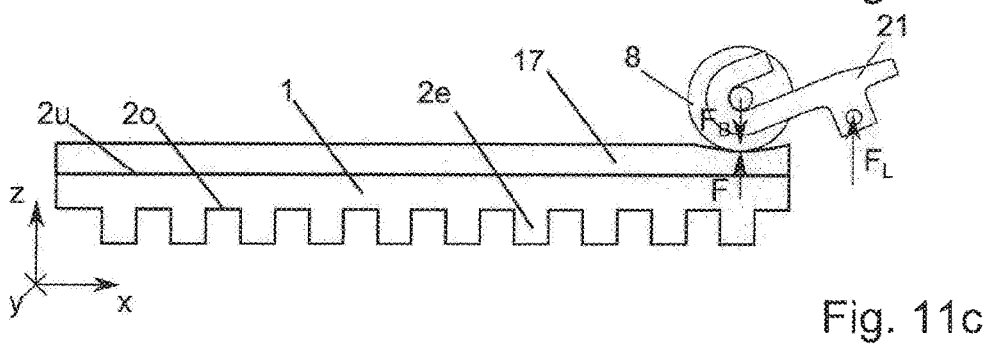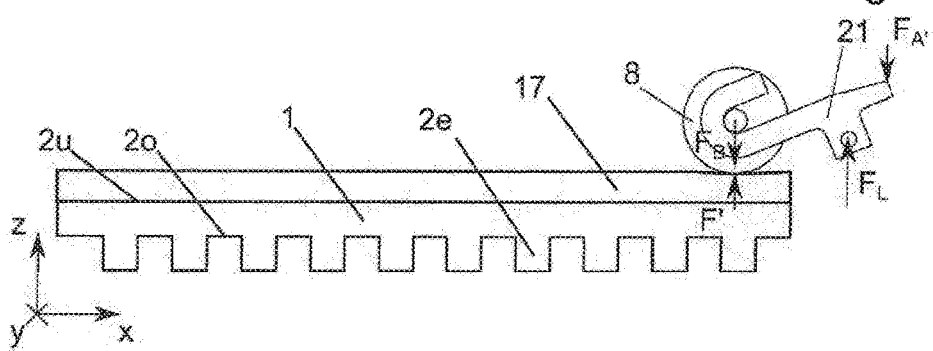

DEVICE AND METHOD FOR EMBOSSING MICRO- AND/OR NANOSTRUCTURES

FIELD OF THE INVENTION

The invention relates to an apparatus and a method for embossing micro- and/or nanostructures.

BACKGROUND OF THE INVENTION

In the prior art, micro- and/or nanostructures are produced either photolithographically and/or with the aid of imprint lithography. Imprint lithography is understood to mean a method, wherein micro- and/or nanometre-size structures are embossed in a material by means of a stamp. The material is an embossing material applied on a substrate. Such imprint processes have increasingly gained in importance in recent years, since they can be carried out more quickly, more effectively and at a lower cost than many photolithographic processes. Furthermore, it has been shown that the attainable resolution by means of imprint-lithographic processes is by no means inferior to the resolution that can be attained with the aid of photolithography.

The apparatuses used in the prior art have a number of drawbacks. The apparatuses are designed for a size that does not permit processing of substrates above a certain diameter, in particular of more than 300 mm, or only does so with difficulty. In principle, a distinction can be made between two different types of imprint apparatuses in the prior art.

Most embodiments are incorporated in so-called mask aligners or are designed as an independent apparatus, which however cannot process substrates larger than 300 mm. In particular, mask aligners are suitable for special imprint apparatuses, since they have already experienced widespread use for photolithography in the semiconductor industry. It has therefore been expedient for suppliers to offer extensions or add-ons that were able to build on already known mask aligner technology or to expand the latter. The advantage of mask aligners lies primarily in the fact that in most cases they already offer optical systems, in particular lamp houses, for the in particular full-area illumination of the substrates and therefore the embossed embossing materials.

Apart from modified or extended mask aligners, there are also dedicated imprint apparatuses which have been designed on and for special embodiments. These apparatuses are usually highly precise alignment apparatuses, which can align a stamp with ever higher precision relative to the substrate. Furthermore, these apparatuses have the capability of generating a vacuum, a special dispensing system etc. Such imprint apparatuses only rarely have the capability of embossing an embossing material on a substrate of more than 300 mm.

The aforementioned circumstances give rise to the problem that the embossing of large-format, in particular rectangular, substrates, such as are required for example for flat screen production, cannot be implemented or can only be so with great difficulty. Sometimes, a structure is to be embossed even on substrates with a size which is such that a plurality of individual large screen parts are formed from the substrate. An extreme increase in throughput would thus result according to the invention, which would have a favourable effect on costs.

Moreover, there is also the problem of suitably illuminating the embossed areas. The illumination systems would have to be designed extremely large, which would lead to an apparatus that could not be implemented for technical reasons.

A further problem is the removal of the very large stamp from the large areas. The stamp release must be controlled and monitored in a highly precise manner and, in particular, must take place in such a way that the embossed structure and the stamp do not suffer any damage during the removal of the stamp.

The present prior art for the micro- and/or nanostructuring of surfaces primarily comprises photolithography and the various embossing techniques. The embossing techniques operate either with hard or soft stamps. In recent times, embossing lithography techniques have chiefly become established and are replacing the conventional photolithography techniques. Among the photolithography techniques, the use of so-called soft stamps is in particular becoming increasingly more popular. The reason lies in the easy production of the stamps, efficient embossing processes, very good surface properties of the given stamp materials, low costs, the reproducibility of the embossed product and in particular the possibility of the elastic deformation of the stamp during the embossing and the removal. A stamp made in an elastomer with a micro- or nanostructured surface is used in soft lithography in order to produce structures in the range from 20 nm to >1000 µm.

There are six known techniques:
micro- and/or nano-contact printing (µ/nCP)
replica moulding (REM)
micro-transfer moulding (µTM) or nanoimprint lithography (NIL)
micro-moulding in capillaries (MIMIC)
solvent-assisted micro-moulding (SAMIM) and
phase-shift lithography Elastomer stamps are produced as a negative of a master. The master stamp is a hard stamp made of metal, plastic and/or a ceramic, which is produced as a one-off by correspondingly costly processes. An arbitrary number of elastomer stamps can then be produced from the master. The elastomer stamps enable a conformal, uniform contact over large surfaces. They can easily be separated from their master stamp, as well as from the embossed products. Furthermore, elastomer stamps have a low surface energy for an easy and simple separation of stamp and substrate. For the automated implementation of soft-lithographic processes, it is necessary to support the elastomer stamp by means of a carrier. Glass carrier substrates with varying thicknesses are currently used. As a result of using thick glass substrates, however, the elastomer stamp loses its flexibility, at least in part.

A master can in particular be produced by a step-and-repeat process (S&R process). This is mainly advantageous when very large masters have to be produced. The master is thereby produced by a further master-master. In the technical language, however, the master from which the soft stamps are moulded are usually referred to as sub-masters and the master for producing the sub-master is referred to as a master. The definitions may vary. It is however disclosed that an in particular large-area master (or sub-master) that is used to mould soft stamps can be produced by a repeated embossing process (step-and-repeat process), which is characterised in that embossing is carried out at a first point, then the master-master (or master) is moved and then embossing is carried out at least one further time.

Furthermore, it is conceivable for a master to be used in a step-and-repeat process in order to emboss the elastomer stamp directly. This is mainly advantageous when the elastomer stamp is very large. The master is moved to a first position, embosses the elastomer stamp there, then moves to a second position different from the first position and embosses again.

This process can be continued until such time as an elastomer stamp of arbitrary size has been produced.

The use of rigid carriers generally makes the automatic separation of stamp and substrate difficult after the embossing process, as a result of which process automation and industrial exploitation of imprint lithography can be implemented only with difficulty.

A further general problem of stamps is the fact that they usually have only a limited size. It is thus not readily possible to emboss large areas. An option for continuous embossing is represented by roller stamps, which however will not be dealt with further here. For the embossing of micro- and/or nanometer-size structures on large substrates, in particular plates, only very few apparatuses or methods and in particular no fully developed apparatuses or methods exist in the prior art.

It is an objective of the invention to provide an improved apparatus and an improved method for embossing micro- and/or nanostructures, which no longer have the drawbacks of the prior art and with which in particular automation and more rapid processing of large-format substrates can be ensured.

This problem is solved by the subject-matter of the independent claim(s). Advantageous developments of the invention are given in the sub-claims. All combinations of at least two features given in the description, the claims and/or the drawings also fall within the scope of the invention. In stated value ranges, values lying inside the stated limits are also deemed to be disclosed as limiting values and can be claimed in any combination.

The invention relates to an apparatus for embossing micro- and/or nanostructures with a module, wherein the module comprises a structured stamp and at least one mobile embossing element, wherein the module can preferably comprise a lamp house capable of tracking the embossing element.

The lamp house moves, in particular parallel to the substrate surface, at a speed between 1 mm/s and 1000 mm/s, preferably between 5 mm/s and 750 mm/s, still more preferably between 7.5 mm/s and 500 mm/s, most preferably between 10 mm/s and 250 mm/s, with utmost preference at 100 mm/s.

Moreover, the invention relates to a method for embossing micro- and/or nanostructures on a substrate, wherein a mobile embossing element, by the action of a force on a structured stamp, embosses the micro- and/or nanostructures on the substrate, wherein a lamp house can preferably track the embossing element.

The embossing element moves, in particular parallel to the substrate surface, at a speed between 1 mm/s and 1000 mm/s, preferably between 5 mm/s and 750 mm/s, still more preferably between 7.5 mm/s and 500 mm/s, most preferably between 10 mm/s and 250 mm/s, with utmost preference at 100 mm/s. In particular, the embossing element and the lamp house move at the same speed.

As an embossing element or embossing elements, use can be made of all components or assemblies, with the aid of which a generally inhomogeneous, i.e. not constant as a function of location, but preferably homogeneous, i.e. constant as a function of location, linear and/or planar force can be exerted on the structured stamp.

In the remainder of the specification, mention will be made only of a linear force. However, the planar force is always intended to be included.

The structured stamp can on the one hand be pressed into the embossing material by means of the embossing element or the embossing elements. On the other hand, the process of removing the structured stamp from the embossing material can be controlled and monitored in a targeted manner with the aid of the embossing element.

The embossing element or embossing elements may take the form of the following:
solids, in particular
  rollers
  cutting edges
  blades
fluid jets, in particular
  compressed air In the remainder of the specification, the embossing element will be described and represented primarily as a roller by way of example.

Moreover, the invention relates to the use of the apparatus according to the invention for embossing micro- and/or nanostructures on a substrate as well as a substrate with micro- and/or nanostructures embossed with an apparatus according to the invention or a method according to the invention.

Furthermore, the invention relates, in particular as an independent aspect, to a stamp system, comprising a structured stamp (also referred to in the following solely as a stamp), in particular a soft stamp, for embossing micro- and/or nanostructures, and an optional carrier, in particular of glass, connected to the stamp, in particular in a planar manner, wherein the stamp and the optional carrier are constituted elastically, in such a way that they can be deformed by an embossing element. The optional carrier and the stamp are connected to one another in particular by an adhesive layer.

Furthermore, the invention relates, in particular as an independent aspect, to a removal means for separating a structured stamp from an embossing material, in particular for an apparatus according to the invention.

The removal means is an assembly. The first component of the assembly is the embossing element, with the aid of which the withdrawal of the structured stamp from the embossing material can be controlled in a targeted manner. The second component is the embossing element suspension system, with which the embossing element can be controlled.

The third component of the assembly is a clamping bar, with which the structured stamp can be fixed. The fourth component of the assembly is a lifting system for the clamping bar, which lifting system can move the clamping bar along the Z-direction, whilst it can itself be moved in a second direction, in particular a direction normal to the Z-direction.

Furthermore, the invention relates, in particular as an independent aspect, to an embossing element suspension system (also referred to in the following as an embossing element suspension device) for suspending an embossing element of an apparatus, in particular according to the invention, which is constituted such that a force applied to a structured stamp and/or a carrier of the structured stamp can be adjusted by a counterforce in a targeted manner. In the case of the use of nozzles for the application of force on the structured stamp with the aid of a fluid, the embossing element suspension system involves all the components that are used for the targeted fluid control. In particular, this is understood to mean a nozzle, in particular a nozzle which can allow a gas to flow out at a regulatable pressure along a line.

Furthermore, the invention relates, in particular as an independent aspect, to an embossing element suspension device for suspending an embossing element of an apparatus, in particular according to the invention, which is constituted such that the force of the embossing element on the structured stamp can be applied not only uniformly, but also asymmetrically. This is brought about very simply by the fact that the embossing element can be applied with variably controllable forces on the left-hand side and/or the right-hand side by means of the embossing element suspension device.

A targeted control of the force that acts on the structured stamp is thus enabled by the embossing element during the embossing and/or the removal assistance.

Furthermore, the invention in particular describes an apparatus and a method for the controlled, highly precise, fault-free removal of the structured stamp from the embossing surface, in particular by a combined use of removal elements.

Provision is preferably made such that an advancing movement of the lamp house takes place with a translational movement of the embossing element. The advancing movement can take place either simultaneously, i.e. synchronously, with the movement of the embossing element or with a time lag. According to the invention, it is important that the lamp house always illuminates only a section of the embossing material. By means of this embodiment according to the invention, a limitation of the size of the lamp house, in particular the light source, is advantageously made possible. If a tracking lamp house is not expedient, the entire structured stamp, and therefore the embossing material, can be illuminated over the entire area with a correspondingly large light source or a suitable optical system.

The stamp is preferably fixed on a carrier (engl.: backplane), in particular a plate, most preferably a glass carrier. Further conceivable materials for the carrier are polymers and/or metals. The polymers are preferably used as plastic films and/or thin plastic sheets, the metals preferably as metal foils and/or thin metal sheets. The carrier has a thickness between 10 µm and 1000 µm, preferably between 50 µm and 800 µm, still more preferably between 100 µm and 600 µm, most preferably between 150 µm and 400 µm, with utmost preference 200 µm.

The stamp is acted upon on a force-application side according to the invention along its entire length, in particular in a continuous process, with a linear force, which in particular extends perpendicular to the length and is homogeneous in particular along the entire length, in order to press the structures into the embossing material. The application preferably takes place with the aid of an embossing element, in particular a preferably rigid embossing roller. The corresponding structure is in principle already known from publication WO 2014037044 A1. The inventive aspect of the present invention includes in particular in the description of an apparatus and a method, wherein the embodiment for large-format embossing mentioned in publication WO 2014037044 A1 can be used. According to the invention, however, the frame mentioned in publication WO 2014037044 A1 is dispensed with so that the structured stamp can be withdrawn.

The linear force can also be inhomogeneous in a development of the embodiment according to the invention. An inhomogeneous linear force can be achieved in particular by the fact that the embossing element is acted upon on its left-hand suspension point with a force which is different from the force in the right-hand suspension point. As a result of the possibility of generating an inhomogeneous linear force, structured stamps with a high density of nanostructures on the right-hand side, for example, can also be subjected to a greater load there in order to ensure homogeneous embossing of the entire embossing material.

In the subsequent text, a stamp is understood to mean any kind of component which has corresponding structured elements at its surface and has the inventive flexibility during the embossing process. A stamp can be a single component or a combined component. If the stamp is constituted solely as a single component, the stamp is made of a film a flexible sheet, in which the corresponding structured elements have been produced. In the case of a combined stamp, i.e. a stamp system, the latter comprises a carrier and a corresponding stamp component comprising the structured elements. In this case, the carrier and/or the stamp component must, as an assembly, have the required flexibility in order to be duly deformed by the embossing element. The carrier is made in particular from one of the following materials.

semiconductor
    Ge, Si, alpha-Sn, B, Se, Te
metal
    Cu, Ag, Au, Al, Fe, Ni, Co, Pt, W, Cr, Pb, Ti, Ta, Zn, Sn
compound semiconductor
    GaAs, GaN, InP, $In_xGa_{1-x}N$, InSb, InAs, GaSb, AlN, InN, GaP, BeTe, ZnO, CuInGaSe2, ZnS, ZnSe, ZnTe, CdS, CdSe, CdTe, $Hg_{(1-x)}Cd_{(x)}Te$, BeSe, HgS, $Al_xGa_{1-x}As$, GaS, GaSe, GaTe, InS, InSe, InTe, CuInSe2, CuInS2, CInGaS2, SiC, SiGe
glass
    metallic glasses
    Non-metallic glasses, in particular
        organic non-metallic glasses
        inorganic non-metallic glasses, in particular
        non-oxidic glasses, in particular
            halide glasses
            chalcogenide glasses
        oxidic glasses, in particular
            phosphatic glasses
            silicate glasses, in particular
            alumosilicate glasses
            lead silicate glasses
            alkali silicate glasses, in particular
            alkaline earth silicate glasses
            borosilicate glasses
            borate glasses, in particular
            alkali borate glasses
plastics, in particular
    elastomers, in particular
        Viton (material) and/or
        polyurethane and/or
        hypalon (material) and/or
        isoprene rubber (material) and/or
        nitrile rubber (material) and/or
        perfluorinated rubber (material) and/or
        polyisobutene (material) and/or
        polyethylene terephthalate (PET) and/or
        polycarbonate (PC) and/or
        polymethyl methacrylate (PMMA) and/or
        Kapton (material)

A linear force according to the present invention means that the application of force takes place at least predominantly, in particular completely, in a first direction, in particular perpendicular to the movement of an embossing element along the stamp (i.e. for example encompasses the entire effective width of the stamp), whilst in a second direction (in particular perpendicular to the first direction) only a comparatively very small region (in particular in the ratio 1 to 5, preferably 1 to 10, still more preferably 1 to 20, still more preferably 1 to 100 to the first direction) is at the same time acted on. A comparatively small application area in comparison with the entire area of the stamp thus results that is simultaneously acted on. Not only is a very defined application thus enabled, but also very homogeneous embossing is achieved. In the case of an inhomogeneous distribution of structured elements on the stamp, an inhomogeneous linear force may especially be required for homogeneous embossing.

The stamp and all the necessary parts for performing a process according to the invention are referred to in the subsequent text as a module. The module includes in particular the stamp, the embossing element with the embossing element suspension system, the lamp house and the removal means.

A first embodiment according to the invention includes embossing large substrates, the diameter whereof still lies however within the order of magnitude of the stamp. The film stamp is thus still able to emboss a substrate in a single complete step, without having to be placed at a further position by a step-and-repeat process. The substrates are however already so large that the use of a lamp house illuminating the embossing material on the substrate over the entire area is not possible, or is so only with great difficulty. The lamp house is therefore preferably modified in such a way that it can illuminate stepwise or continuously partial segments of the embossing material, in particular rectangular sections. An idea according to the invention includes in particular in moving the lamp house over the already embossed surface sections of the embossing material. For the sake of completeness, it is mentioned that, whilst a full-area illumination takes time and effort, is expensive and extremely complicated, it is nonetheless possible.

The apparatus and the method can respectively be operated or carried out optionally in the step-and-repeat operation. An optional aspect of the invention includes in particular the possibility of being able to move the module in a step-and-repeat process over very large areas and thus of being able to emboss areas of several square metres, in that the stamping process according to the invention is carried out at each individual step-and-repeat position. Moreover, the invention thus permits a large-area application of the embossing process, in particular with a width greater than 0.01 m, preferably greater than 1.0 m, still more preferably greater than 10 m and/or a length greater than 0.01 m, preferably greater than 5 m, still more preferably greater than 10 m.

A further optional aspect is the use of the module at at least one side of an endless substrate. An endless substrate is understood to mean a substrate stored in particular on a first roll, the length whereof is many times greater than its width. An endless substrate is in particular an endless film. The endless substrate can also be formed from glass, if the glass is thin enough to be bent without breaking. Typical glass thicknesses are less than 1000 μm, preferably less than 500 μm, still more preferably less than 250 μm, most preferably less than 100 μm.

By means of different processes, in particular heat treatments, hardening processes etc., the glass, in particular its surface, can be modified in such a way that it can be rolled up. According to the invention, the module can be used to carry out an embossing process according to the invention on a part of the endless substrate. The module, in particular the stamp, is then removed from the endless substrate and the endless substrate is moved onward by a desired unit, in particular at least the length of the embossed structure. According to the invention, a further embossing process can then take place. By means of this special embodiment, the module is preferably moved only in the direction normal to the endless substrate, while the endless substrate is moved onward in a stepwise manner. The endless substrate is preferably stored in a storage unit, in particular a second roll.

The structured stamp according to the invention is developed further, in that the stamp is clamped by means of two clamping bars arranged at the two mutually opposite clamping sides. The clamping bars comprise in particular fixing means for fixing the stamp. Each clamping bar can be fixed to the stamp either directly or via a spring system. Preferably, however, at least one of the clamping bars is fixed to the stamp by means of springs.

The embossing roller can in particular comprise a motor, which permits the active rotation of the embossing roller. It is also conceivable that the embossing roller can be rotated in a controlled manner by an external motor via a gear unit.

The translational speed of the embossing roller lies between 0.1 mm/s and 1000 mm/s, preferably between 1.0 mm/s and 750 mm/s, still more preferably between 10 mm/s and 500 mm/s, most preferably between 75 mm/s and 250 mm/s, with utmost preference at 100 mm/s.

In a development of the present invention, provision is made such that the stamp is constituted by a carrier and an in particular elastomer stamp moulded or hot-embossed on said carrier. The production of the structured stamp is thus more favourable.

The elastomer stamp is in particular made of one of the following
 polydimethyl siloxane (PDMS)
 perfluropolyether (PFPE)
 polyhedral oligomeric silesium quioxane (POSS)
 polydimethyl siloxane (PDMS)
 tetraethyl orthosilicate (TEOS)
 poly(organo)siloxanes (silicone)

The use of the following materials would also be conceivable
 acrylic ester styrene acrylonitrile
 acrylonitrile/methyl methacrylate
 acrylonitrile/butadiene/acrylate
 acrylonitrile/chlorinated polyethylene/styrene
 acrylonitrile butadiene styrene
 acrylic polymers
 alkyd resins
 butadiene rubber
 butyl rubber
 casein plastics, synthetic horn
 cellulose acetate
 cellulose ether and derivatives
 cellulose hydrate
 cellulose nitrate
 chitine, chitosane
 chloroprene rubber
 cycloolefine copolymers
 uniform polyvinyl chloride
 epoxy resin
 ethylene-ethylacrylate copolymer
 ethylene-polyvinyl acetate
 ethylene-propylene copolymer
 ethylene-propylene-diene copolymer ethylene-vinyl acetate
expandable polystyrene
fluorinated rubber
urea-formaldehyde resin
urea resins
isoprene rubber
lignin
melamine-formaldehyde resin
melamine resins
methylacrylate/butadiene/styrene
natural rubber
perfluoroalkoxyl alkane
phenol formaldehyde resin
polyacetals
polyacrylonitrile
polyamide
polybutylene succinate
polybutylene terephthalate
polycaprolactone
polycarbonate
polycarbonates
polyclorotrichloroethylene
polyester
polyester amide
polyether alcohols
polyether block amide
polyether imide
polyether ketones
polyether sulphone
polyethylene
polyethylene terephthalate
polyhydroxyalkanoates
polyhydroxybutyrate
polyimide
polyisobutylene
polylactide (polylactic acid)
polymethacryl methylimide
polymethyl methacrylate
polymethyl pentene
polyoxymethylene or polyacetal
polyphenylene ether
polyphenylene sulphide
polyphthalamide
polypropylene
polypropylene copolymers
polypyrrol
polystyrene
polysulphone
polytetrafluoroethylene
polytrimethylene terephthalate
polyurethane
polyvinyl acetate
polyvinyl butyral
polyvinyl chloride (hard PVC)
polyvinyl chloride (soft PVC)
polyvinylidene fluoride
polyvinyl pyrrolidone
styrene acrylonitrile copolymerisate
styrene butadiene rubber
styrene butadiene styrene
synthetic rubber
thermoplastic polyurethane
unsaturated polyester
vinyl acetate copolymers
vinyl chloride/ethylene/methacrylate
vinyl chloride/ethylene
vinyl chloride-vinyl acetate copolymers
plasticised polyvinyl chloride A device for embossing an embossing pattern on an embossing surface is also disclosed with the following features as an independent invention:
  a stamp holder for holding and moving a stamp or stamp system, in particular according to a previously described stamp or stamp system,
  an embossing material holder for holding and arranging an embossing material relative to the stamp,
  an embossing element drive for moving an embossing element along the stamp, said embossing element being constituted in particular according to one as described in the present case.

According to the device, a control device is also disclosed for controlling the described method according to the invention and for carrying out the described movements of the components of the device and/or of the structured stamp, or of the embossing element, individually or in common. Corresponding drives and guide elements for carrying out the movements are thus also assigned to the device.

A further, in particular independent, aspect relates to removal means, with the aid of which the stamp or the stamp system can be separated from the embossing material in the optimum manner. The stamp is fixed by at least one clamping bar, which can move in the z-direction by means of a lifting system. The clamping bar is mounted rotatably in the lifting system, in particular by means of other components. At the same time, the lifting system can be moved in a second direction, in particular the x-direction, so that the clamping bar can be moved along an arbitrarily removal curve. The removal curve is in particular one of the following functions:
  polynomial, in particular
    straight-line,
    parabola
  root function
  logarithmic function
  trigonometric function, in particular
    sine function
  step function The translational speed of the removal means in the x- and/or z-direction lies between 0.1 mm/s and 100 mm/s, preferably between 1 mm/s and 75 mm/s, still more preferably between 5 mm/s and 50 mm/s.

As an independent invention, moreover, a method for embossing an embossing material on an embossing surface of an embossing material is disclosed with the following steps, in particular the following sequence:
  arrangement of the stamp face of a structured stamp or a stamp system, in particular according to the above description, relative to the embossing material,
  movement of an embossing element along the structured stamp and embossing of the embossing material by applying the stamp face to the embossing material.

The embossing force must be correspondingly great with correspondingly large embodiments of the device according to the invention. The embossing force is preferably stated per metre. The following exemplary value ranges for an inventive embodiment of the invention are disclosed. The embossing force applied per metre lies in the value range between 0 N/m and 1000 N/m, preferably between 10 N/m and 500 N/m, more preferably between 25 N/m and 250 N/m, most preferably between 50 N/m and 100 N/m. The embossing force can be controlled, in particular by formulas which are stored in software and/or firmware and/or hardware. Furthermore, a dynamic change in the embossing force during the embossing process is conceivable.

A dynamic change is understood to mean that the control is adapted to unforeseeable circumstances. For example, it could be noted in a formula how the embossing force is to be applied as a function of the location. If, during the embossing process, a force is measured which differs from the setpoint force, for example due to unevenness present in the sample holder or substrate, the embossing force can be readjusted to the setpoint value.

Another, in particular independent, subject-matter of the present invention relates to an apparatus for embossing micro- and/or nanostructures in an embossing material, comprising a structured stamp or a stamp system and a mobile embossing element, wherein a removal of the structured stamp or the stamp system from the embossing material can be controlled in a targeted manner.

Another, in particular independent, subject-matter relates to a method for embossing micro- and/or nanostructures, wherein an embossing element embosses the micro- and/or nanostructures in the embossing material by the action of a force exerted on a structured stamp or a stamp system, wherein a removal of the structured stamp or the stamp system from the embossing material is controlled in a targeted manner.

Another, in particular independent, subject-matter relates to a stamp system, comprising a structured stamp, in particular a soft stamp, for embossing micro- and/or nanostructures and a carrier, in particular made of glass, connected to the structured stamp, in particular over its area, wherein the structured stamp and the carrier are constituted elastic, in such a way that they can be deformed by an embossing element.

Another, in particular independent, subject-matter relates to removal means for separating a structured stamp from embossing material, in particular for an apparatus or method according to the invention, wherein the removal means are constituted for effecting a linear movement, preferably directed normal to an embossing surface, of a side of the structured stamp.

Another, in particular independent, subject-matter relates to an embossing element suspension system for suspending an embossing element of an apparatus, in particular according to the invention, said embossing element suspension system being constituted such that a force acting on a structured stamp and/or a carrier of the structured stamp can be adjusted in a targeted manner by means of a counterforce.

The description of further aspects, features and/or embodiments of the invention relate equally to the apparatuses, the methods, the stamp system, the removal means and/or the embossing element suspension system.

In a preferred embodiment, the apparatus and/or the method is constituted for the step-and-repeated operation.

In another preferred embodiment, provision is made such that removal means are provided for separating the structured stamp from the embossing material.

In another preferred embodiment, the removal means are directed preferably normal to an embossing surface to effect a linear movement.

In another preferred embodiment, the removal means comprise rods, preferably mounted linear elements.

In another preferred embodiment, the removal means are connected to the structured stamp, in particular to a clamping bar which holds the structured stamp and/or a carrier with the structured stamp.

In another preferred embodiment, the apparatus and/or the method comprises an embossing element suspension device (also referred to in the description as an embossing element suspension system), which is constituted such that a force acting on the structured stamp and/or a carrier of the structured stamp can be adjusted in a targeted manner by means of a counterforce.

Provision is preferably made such that the embossing element suspension device is constituted as a rotatably mounted rocker and/or carrier and/or as a spiral.

Furthermore, provision is preferably made such that the structured stamp is fixed, in particular laterally, by at least one clamping bar, wherein the at least one clamping bar can be moved, in particular by means of a lifting system, perpendicular to an embossing surface and/or in a z-direction.

Furthermore, provision is preferably made such that the clamping bar is mounted rotatably, in particular rotatable about a rotation axis which is arranged parallel to the embossing surface and/or perpendicular to the Z-direction and/or perpendicular to the movement direction of the embossing element and/or parallel to the Y-direction.

Furthermore, provision is preferably made such that the at least one clamping bar, in particular the lifting system, can be moved in particular simultaneously in a second direction, in particular in the x-direction and/or parallel to the embossing surface and/or parallel to the movement direction of the embossing element.

Furthermore, provision is preferably made such that the clamping bar can be moved along a removal curve, wherein the removal curve is in particular one of the following functions:
polynomial, in particular
    straight line
    parabola
root function
logarithmic function
trigonometric function, in particular
    sine function
step function.

Furthermore, provision is preferably made such that the translational speed of the removal means lies between 0.1 mm/s and 100 mm/s, preferably between 1 mm/s and 75 mm/s, still more preferably between 5 mm/s and 50 mm/s.

The removal of the structured stamp or the stamp system from the embossing material takes place in particular by the targeted movement of a clamping bar via the movement of a rotatably mounted cross-member in a holding fixture. The clamping bar fixes the stamp and is connected via springs to a rotatably mountable cross-member, which is fixed in a holding fixture which can be moved in a translational manner. In special embodiments, it is also conceivable that the springs and the rotatably mountable cross-member are dispensed with and the clamping bar itself is mounted rotatably in the holding fixture. The technical advantage of the spring system, which fixes the stamp in a flexible manner, is however thereby lost. The holding fixture is moved in a targeted manner along a lifting system in a first direction. The translational movement of the lifting system along a second direction, in particular along a rail, can take place in particular simultaneously.

As a result of the combination of two movements, the clamping bar can be moved along an arbitrary curve. The embossing element acts in particular simultaneously on the structured stamp or the stamp system and thus has a decisive influence on the release of the structured stamp or the stamp system from the embossing material.

The following considerations describe the resultant forces that lead to a movement of the sub-systems in question, not the cutting forces. The forces are generally functions of time.

The embossing element presses with a force $F_{R(t)}$ on the structured stamp. Force $F_{R(t)}$ can be broken down into a horizontal force $F_{RH(t)}$ and a vertical force $F_{RV(t)}$.

At the same time, the removal means (also referred to in this description as removal elements) withdraw the structured stamp and thus generate a force $F_{S(u,t)}$, which can also be broken down into a horizontal force $F_{SH(u,t)}$ and a vertical force $F_{SV(u,t)}$. Force $F_{S(u,t)}$ acts at each point of the structured stamp, but generally changes its direction with the position in the structured stamp.

Forces $F_{S(u,t)}$, $F_{SH(u,t)}$ and $F_{SV(u,t)}$ are also specified, apart from time, as functions of coordinate u, wherein u is the position along the, in particular also curved, structured stamp, proceeding from one of its ends.

By the movement, in particular acceleration, of the embossing element and the removal element, forces $F_{S(u,t)}$, $F_{SH(u,t)}$ and $F_{SV(u,t)}$ can thus be adjusted in a targeted manner and the removal of the structured stamp from the embossing material can thus be controlled in a targeted manner.

In particular, large force components $F_{SV(u,t)}$ and small force components forces $F_{SH(u,t)}$ are preferable close to the removal. The nanostructures of the structured stamp are thus predominantly lifted out of the embossed structures of the embossing material, whereas a lateral application of force on the embossed nanostructures of the embossing material is as far as possible prevented.

The control of the forces takes place in particular by means of hardware and/or firmware and/or software. In particular, there are force-measuring sensors in the removal means and/or in the embossing element.

Large radii of the embossing element, in particular an embossing roller, promote a greater force component $F_{SH(u,t)}$, but provide the nanostructures of the structured stamp with the possibility, over a longer distance, of being removed from the embossed nanostructures of the embossing material largely in the normal direction to the embossing surface. Small radii of the embossing element, on the other hand, promote a greater force component $F_{SV(u,t)}$, which promotes the removal in the normal direction to the embossing surface, and are removed relatively quickly in the normal direction to the embossing surface.

In particular, release angle α can be kept constant by a predefined radius of the embossing element. The release angle is defined as the angle between the horizontal and the tangent to the curvature curve of the nanostructures. The release angle is in particular less than 5°, preferably less than 1°, still more preferably less than 0.1°, most preferably less than 0.01°, with utmost preference less than 0.001°.

In particular, the entire microscopic removal behaviour is constant over the entire area to be removed.

The required force for the release of the nanostructures of the structured stamp from the embossed nanostructures of the embossed material is in particular also dependent on the size of the nanostructures. The smaller the nanostructures, the larger their total free surface and the greater the adhesive friction to be overcome between the nanostructures of the structured stamp and the embossed nanostructures of the embossed material. Furthermore, the aspect ratio, i.e. the ratio between the height and the width or length of the structures, plays a decisive role. Such considerations are chiefly of importance when the nanostructure density is a function of the location.

The required force for the release of the nanostructures can be measured precisely by the force-measuring sensors, which are located in particular in the removal means and/or in the embossing element, and can be regulated by the control systems present. The direction and magnitude of the removal force can be controlled in a targeted manner by a targeted interaction of the force and position control of the roller stamp and the remaining removal elements. This can take place dynamically during the removal process either by means of a formula or by means of a control loop and the establishment of limiting parameters. Already measured and/or calculated removal forces are preferably used as limiting parameters. If a force exceeds or falls below the correspondingly predefined limiting value, the desired setpoint value is immediately reset by the control loop.

It may be necessary to apply an inhomogeneous linear force to the embossing element during the deformation action depending on the nanostructure density. It would be conceivable, for example, for the nanostructures to become denser along the y-direction from the left-hand side to the right-hand side. The required release force thus increases along the y-direction from left to right. Accordingly, a greater force must be applied to the structured stamp on the right-hand side. This is most easily brought about by the fact that a constant, homogeneous force is applied to the clamping bar along the entire length of the y-direction via the removal elements connected to it, but that the embossing element presses against the structured stamp on the right-hand side with a smaller force compared to the left-hand side during the removal. The resultant release force is thus greater on the right-hand side.

Force-measuring sensors can be used to measure the force, in particular the linear force. A measurement of an averaged force or the course of a force along the line on which the linear force acts is conceivable. The embossing process can preferably be controlled and optimised by measuring the force that the embossing roller exerts on the embossing material.

If the embossing element is designed as a roller, the roller can in particular comprise a coating. The coating can have a favourable effect on the embossing and removal behaviour. Soft coatings, in particular, permit a local deformation of the embossing element and thus prevent an excessively strong action on the embossed nanostructures of the embossing material. The coating material has a Vickers hardness less than 10,000, preferably less than 5000, still more preferably less than 2000, still more preferably less than 500, most preferably less than 100, with utmost preference less than 50. The E-modulus of the coating material is less than 1000 GPa, preferably less than 500 GPa, still more preferably less than 200 GPa, most preferably less than 100 GPa, with utmost preference less than 10 GPa.

A further preferred embodiment is a roller holding fixture (also referred to generally as an embossing element suspension system or embossing element suspension device). The embossing element suspension system is designed in such a way that a force acting on the stamp or the carrier can be adjusted in a targeted manner by means of a counterforce. A very precise and easy control of the force acting on the stamp and/or the carrier is thus advantageously made possible. The embossing element suspension device can be constituted as a rotatably mounted rocker or as a rotatably mounted carrier. Alternatively, the embossing element suspension device can be constituted as a spiral.

Features of the device and/or the structured stamp disclosed according to the device are also deemed to be disclosed as features of the method and vice versa.

Further advantages, features and details of the invention emerge from the following description of preferred examples of embodiment and with the aid of the drawings.

BRIEF DESCRIPTION OF THE DRAWINGS

FIG. 10a shows a diagrammatic linear representation of a first embossing element suspension system according to the invention, FIG. 10b shows a diagrammatic linear representation of a second embossing element suspension system according to the invention, FIG. 10c shows a diagrammatic linear representation of a third embossing element suspension system, FIG. 11a shows a diagrammatic representation of the use of the first embossing element suspension system according to the invention in a first position, FIG. 11b shows a diagrammatic representation of the embossing element suspension system in a second position, and FIG. 11c shows a diagrammatic representation of the embossing element suspension system and a third position.

Advantages and features of the invention are marked in the figures with reference numbers identifying the latter in each case according to embodiments of the invention, wherein components or features with an identical or identically acting function are marked with identical reference numbers.

DETAILED DESCRIPTION OF THE INVENTION

Figure 1:
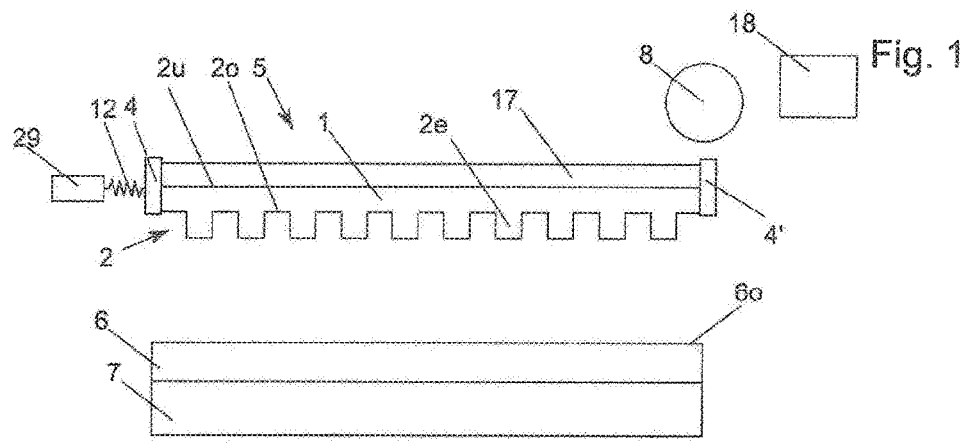
FIG. 1 shows a diagrammatic cross-sectional view of a first embodiment of the present invention, i.e. an inventive first process step of the alignment of an inventive structured stamp relative to an embossing material applied on a substrate.

The features according to the invention are not represented true to scale in the figures, in order to be able to represent primarily the function of the individual features. The ratios of the individual components are in part disproportionate, which is due in particular to nanostructures $2e$ and $31$ being represented in a much enlarged form.

Nanostructures $2e$ of a structured stamp $1$, which are used for the embossing of corresponding nanostructures $31$ on workpieces, lie in the nanometer and/or micron range, whilst the order of magnitude of the machine components lies in the centimetre range.

In particular, the ratio between the thickness of a carrier $17$ and the thickness of a stamp face $2$ is not represented true to scale. The thickness of stamp face $2$ is several orders of magnitude smaller than the thickness of carrier $17$.

The dimensions of individual nanostructures $2e$ of stamp face $2$ preferably lie in the micron and/or nanometer range. The dimensions of individual nanostructures $2e$ are less than 1000 μm, preferably less than 10 μm, more preferably less than 100 nm, still more preferably less than 75 nm, with utmost preference less than 50 nm.

The thickness of carrier $17$ is less than 2000 μm, preferably less than 1000 μm, more preferably less than 500 μm, still more preferably less than 100 μm, with utmost preference less than 10 μm.

An embossing process according to the invention is represented in the individual steps in FIGS. 1 to 4.

A stamp system $5$ comprises a stamp $1$ (also referred to below as structured stamp $1$) which is fixed to a carrier $17$.

Stamp $1$ has a micro- or nanostructured stamp face $2$ with nanostructures $2e$ (elevations), which stand out from an embossing side $2o$ of stamp $1$.

A force-application side $2u$ lying opposite stamp face $2$ is constituted plane flat, in order to enable as homogeneous a force-application as possible on stamp $1$ at force-application side $2u$.

For the force application, use is made of an embossing element $8$, preferably in the form of an embossing roller, which, after alignment of stamp system $5$ relative to an embossing material $6$ applied on a substrate $7$ (see FIG. 1) and a subsequent approach of stamp system $5$ towards an embossing surface $6o$ of embossing material $6$, is lowered onto force-application side $2u$.

The embodiment according to the invention comprises two clamping bars $4, 4'$, in which stamp system $5$ is clamped. At least one of clamping bars $4, 4'$ is connected either rigidly or via a spring system, comprising a plurality of springs $12$, to a rotatably mounted cross-member $29$.

The use of a spring system as a coupling between at least one of clamping bars $4, 4'$ and rotatably mounted cross-member $29$ serves to increase the flexibility of stamp $1$ when it is acted upon by embossing element $8$.

The spring system comprises at least two, preferably more than five, most preferably more than ten, with utmost preference more than twenty springs $12$.

Figure 2:
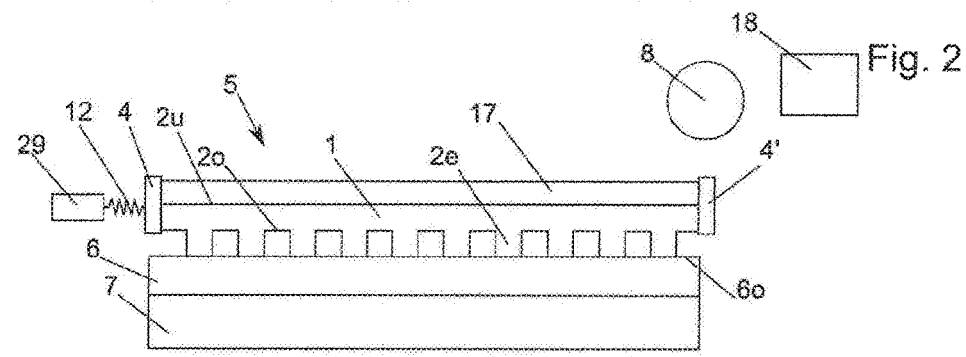
FIG. 2 shows a diagrammatic cross-sectional view of an inventive second process step of the approach of the structured stamp towards the embossing material to the embossed.
Figure 3:
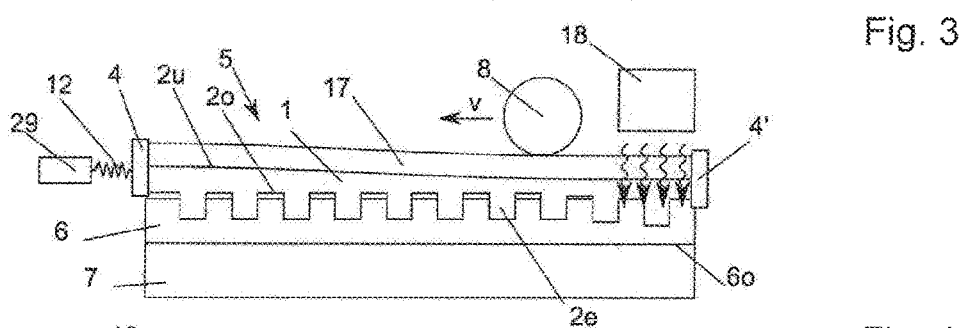
FIG. 3 shows a diagrammatic cross-sectional view of a third process step of the force-application by an embossing element on the structured stamp (start of embossing)

The action on force-application side $2u$ exerted by embossing element $8$ takes place in particular simultaneously with contacting or an insertion of nanostructures $2e$ into embossing material $6$ (see FIG. 3), wherein the approach of stamp system $5$ towards embossing material $6$ according to FIG. 2 preferably takes place in parallel (as the case may be, with minimal angling (wedge error) of stamp system $5$).

Nanostructures $2e$ are inserted into embossing material $6$, in particular comprising a material having low viscosity, and, during the approach of stamp system $5$ towards embossing material $6$, an embossing force is transferred to force-application side $2u$ by embossing element $8$, in particular with stamp $1$ being arranged in parallel with the embossing material $6$.

Stamp $1$ is thereby deformed in the direction of the embossing material. This deformation of stamp $1$ is minimal. A deformation of stamp $1$ is accompanied by a distortion of its nanostructures $2e$.

A slightly angled approach of stamp system $5$ according to the invention towards the surface of embossing material $6$ at least at one of the two clamping bars $4, 4'$ is also conceivable, so that the insertion of nanostructures $2e$ takes place gradually.

Embossing element 8 is moved in parallel with the surface of embossing material 6 from first clamping bar 4 towards second clamping bar 4' arranged opposite during the approach of stamp 1 (and, if appropriate, parallelisation of stamp 1) towards embossing material 6, in particular brought about predominantly by the embossing force of embossing element.

Figure 4:
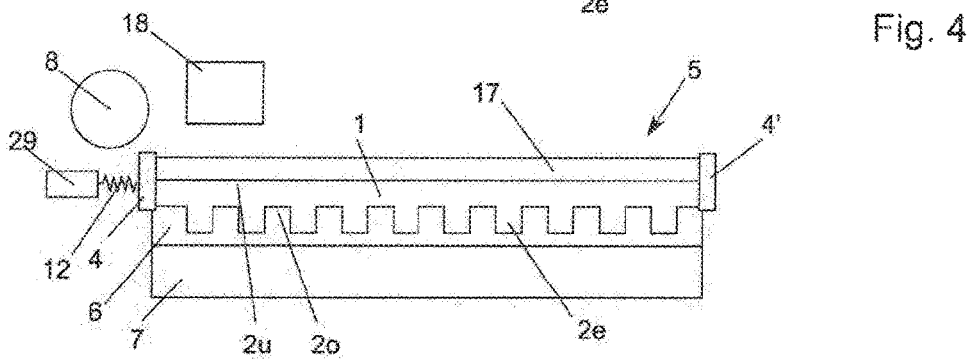
FIG. 4 shows a diagrammatic view of the process step according to FIG. 3 at the end of embossing.

After reaching the position according to FIG. 4, stamp face 2 is completely inserted in embossing material 6 and is correspondingly replicated there.

Subsequently, or even simultaneously during the embossing, curing of embossing material 6 takes place and, after curing of embossing material 6, stamp system 5 can be removed according to the invention.

The curing can take place by all known methods from the front and/or rear side, for example by UV radiation, by chemicals or by heat, as well as by a combination of the aforementioned methods.

The use of an embossing roller as embossing element 8 brings with it the advantage of a rolling movement and an application of pressure with the embossing force, which leads to a minimisation of shearing forces on stamp 1. Furthermore, a complicated wedge error compensation can largely be dispensed with, which would be indispensible if it was desired to carry out the stamping process by a normal movement of the stamp and the embossing material towards one another. This kind of contacting also ensures that air can escape and the correct forming of the structures is not impaired by air inclusions.

Embossing element 8 can alternatively be constituted in such a way that a contactless transfer of force, in particular by a gas flow from a linear nozzle and/or a plurality of puctiform nozzles arranged along a line.

Figure 5:
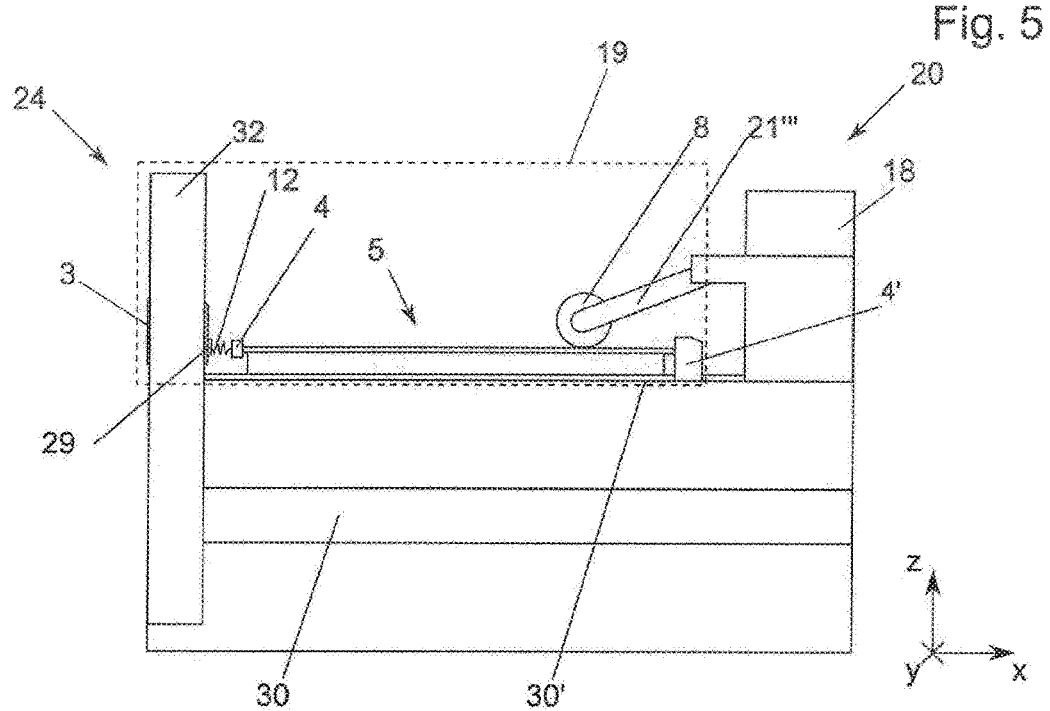
FIG. 5 shows a diagrammatic view of a first apparatus according to the invention in a first position.

FIG. 5 shows a first apparatus 24 according to the invention with a module 20, comprising at least one, in particular tracking, lamp house 18, an embossing element 8, in particular a roller 8, a stamp system 5 and a plurality of components 8, 21''', 4, 12, 29, 3, 32, which will be combined in the following as removal means assembly 19, in a first position. Removal means assembly 19 is surrounded by a dashed-line rectangle in order to indicate it more clearly.

Figure 7A:
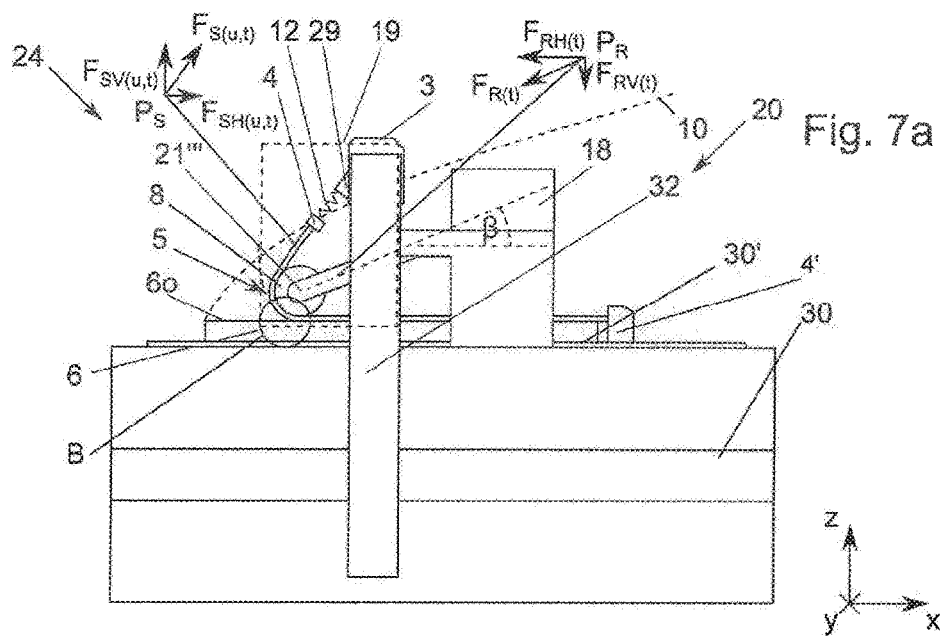
FIG. 7a shows a diagrammatic view of a first apparatus in a third position, in particular a removal position.

Removal means 19 can be seen particularly well in FIG. 7a, where its components are located close to one another in a removal step according to the invention and also surrounded by a dashed-line rectangle in order to be clearly highlighted. It can also be seen that components 8, 21''' participate in precisely the same way in the embossing as well as in the subsequent removal according to the invention. Embossing element 8 is accommodated by an embossing element suspension system 21'''.

FIG. 5 shows embossing element 8 and lamp house 18 in the first position, denoted in particular as a starting position. Stamp system 5 has preferably already been brought into position, so that embossing can start by a transfer of force by means of embossing element 8.

Figure 6:
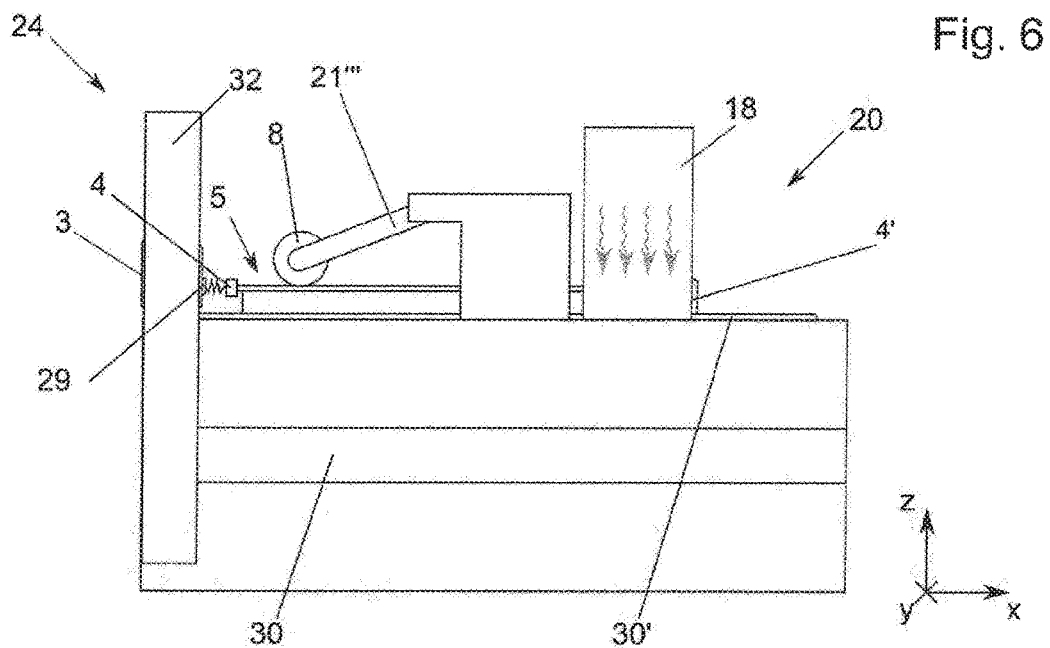
FIG. 6 shows a diagrammatic view of a first apparatus in a second position.

FIG. 6 shows apparatus 24 or previously described module 20 in a second position. The second position is characterised primarily by the fact that an advancing movement of lamp house 18 takes place with the translational movement of embossing element 8.

The advancing movement can take place either simultaneously, i.e. in synchrony, with the movement of embossing element 8 or with a time-lag. The movement of lamp house 18 can in particular be slower than the movement of embossing element 8. In FIG. 6, lamp house 18 lags for example behind embossing roller 8. According to the invention, it is important that lamp house 18 always illuminates only sections of embossing material 6 (not shown, since concealed by stamp system 5). The illumination is represented symbolically by four arrows.

A limitation of the size of lamp house 18, in particular of the light source, is made possible by this embodiment according to the invention. If the embodiment according to the invention does not comprise a tracking lamp house, but rather a full-area illumination, the latter is located above said module and is correspondingly fixed. Such an embodiment has not been shown.

FIG. 7a shows first apparatus 24 or first module 20 in a third position. This position is characterised by the release of stamp system 5 from embossing material 6.

The removal takes place in particular by an interaction of components 21''', 8, 4, 12, 29, 3, 32, which are denoted as a removal means assembly 19 (represented surrounded by a dashed-line). Each of said components contributes its part to the inventive removal of stamp system 5 from embossing material 6.

A force $F_{R(t)}$ is transferred to embossing roller 8 via embossing element suspension system 21'''. In particular, the direction of the force can be influenced by a corresponding adjustment angle $\beta$ of suspension system 21'''.

Embossing roller 8 acts with transferred force $F_R(t)$ on stamp system 5, which is in particular at the same time clamped with a force $F_{S(u,t)}$. The forces have not been shown directly in the respective components, in particular not at the points of action of the forces, but rather have been shown outside the drawing for the sake of clarity. The lines shown, however, indicate the points of action $P_s$ and $P_R$ of the forces thereof.

The force is transferred to stamp system 5 via clamping bar 4, the spring system, in particular via springs 12, from rotatably mounted cross-member 29. Cross-member 29 must be mounted rotatably in a holding fixture 3, in order that components 4 and 12 can also be correspondingly rotated with the movement to the right.

Holding fixture 3 can in particular be moved up and down along the z-direction by means of a lifting system 32. At the same time, lifting system 32 can move along a rail 30 in the x-direction. The approach towards any point in an x-z plane is thus enabled by these degrees of freedom.

As a result of the movement of these components, clamping bar 4, which serves here as a starting point since it has the closest proximity to stamp system 5, can be moved arbitrarily and thus generate an arbitrary force $F_{S(u,t)}$ in stamp 1. In particular, clamping bar 4 moves along a desired removal curve 10.

Irrespective of this, embossing element 8 can also exert an arbitrary force on stamp system 5 via embossing element suspension system 21'''. The force resulting from these forces influences the removal of stamp system 5 from embossing material 6.

Figure 7B:
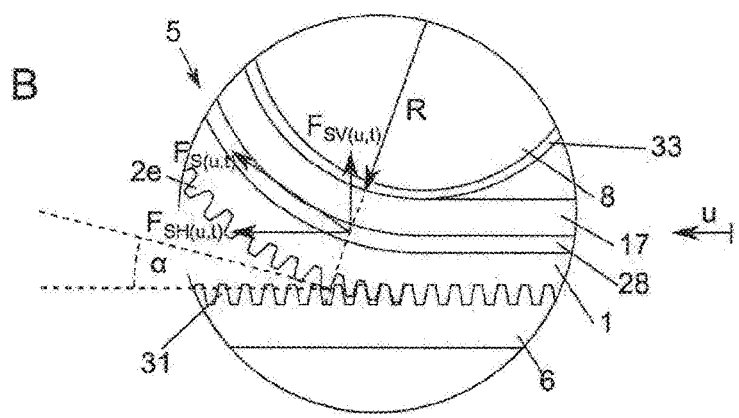
FIG. 7b shows a diagrammatic, enlarged view of a sub-region between the structured stamp and the embossing material.

FIG. 7b shows a diagrammatic, enlarged view of embossing region B between stamp system 5 and embossing material 6. An embossing element 8 can be seen, in particular with a coating 33, which makes contact with carrier 17 at the rear side. Carrier 17 is connected to stamp 1 by a connecting layer 28. The position in stamp system 5 is indicated by coordinate u.

Stamp 1 comprises nanostructures 2e, which leave embossed nanostructures 31 when they are removed from embossing material 6. Acting resultant force $F_{S(u,t)}$ is shown at a point of stamp system 5, said force effecting the removal.

Said force can be broken down into horizontal and vertical force components force $F_{SH(u,t)}$, $F_{SV(u,t)}$. Vertical force component $F_{SV(u, t)}$ participates decisively in the removal of nanostructures 2e from embossing material 6, whereas horizontal force component $F_{SH(u, t)}$ promotes friction of nanostructures 2e on embossed nanostructures 31. Release angle α, which has already been described in this disclosure, can also be seen.

Figure 8:
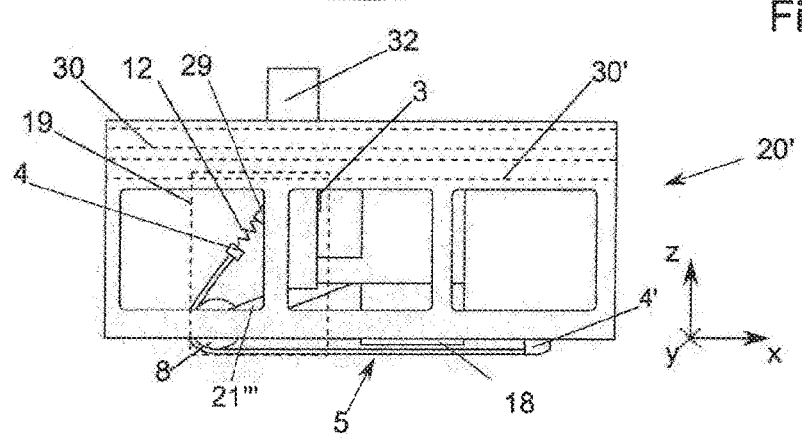
FIG. 8 shows a diagrammatic view of a module for a second apparatus.

FIG. 8 shows a second module 20' according to the invention, which has been designed in such a way that stamp system 5 represents the lowest-lying component. The use of the represented components takes place analogously. In particular, the module can comprise, instead of a tracking lamp house 18, an illumination system for the full-area illumination of stamp system 5.

Figure 9A:
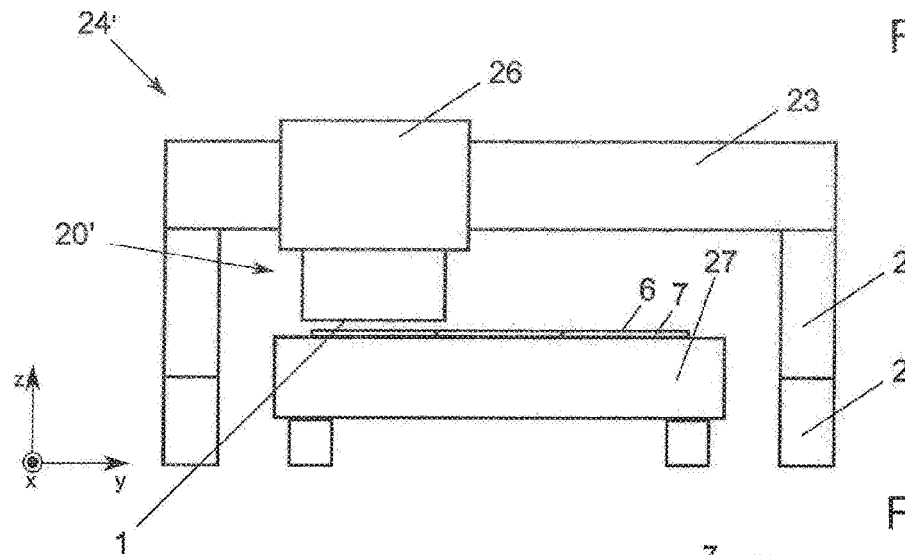
FIG. 9a shows as a diagrammatic front view of a second apparatus according to the invention, designed for a step-and-repeat process.

FIG. 9a shows a diagrammatic front view of a second apparatus 24' according to the invention, comprising a module 20'. Module 20' is fixed by means of a suspension 26 to cross-beam 23. Cross-beam 23 is fixed on both sides to a respective carriage 22. Carriages 22 move along a guide system 25.

As a result of the structure according to the invention, module 20' can travel along the x-direction and/or along the y-direction. Module 20' is in this case designed in such a way that stamp 1 can be positioned. In particular, module 20' can be lowered in such a way that the distance between stamp 1 and embossing material 6 of a substrate 7 on a sample holder 27 can be arbitrarily adjusted in a precise manner.

The load-application on stamp 1 or carrier 17, on which stamp 1 has been fixed, takes place by means of embossing element 8, in particular an embossing roller 8 (see FIG. 8). Furthermore, the tracking of lamp house 18 is also possible.

Figure 9B:
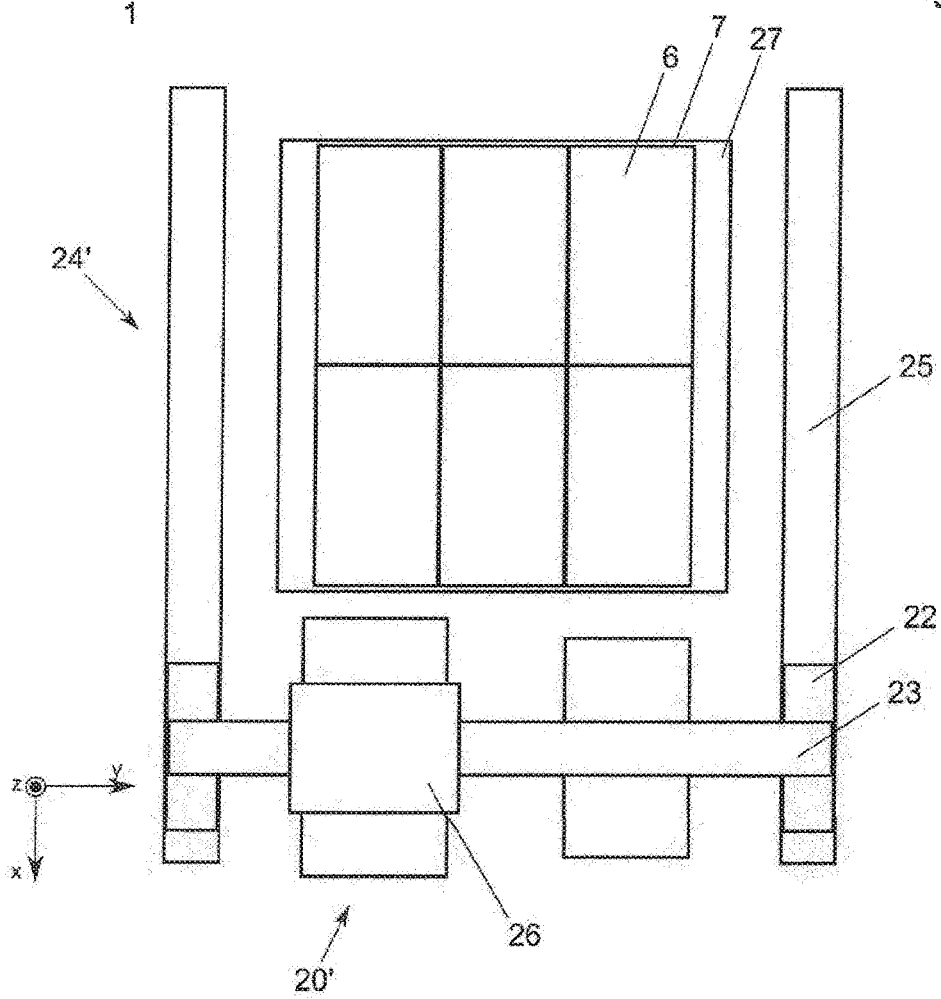
FIG. 9b shows a diagrammatic plan view of the second apparatus according to the invention.

FIG. 9b shows a diagrammatic plan view of second apparatus 24' according to the invention. Six substrates 7 can be seen, which have been coated with an embossing material 6 and have been fixed on sample holder 27. All six substrates 7 can be reached by the translational movement of module 20'. It is also conceivable that a single substrate 6, in particular covering entire sample holder 27, is fixed on sample holder 27.

FIG. 10a shows a diagrammatic line diagram of a first embossing element suspension system 21 according to the invention. Embossing element suspension system 21 is a rocker, comprising a bearing L, a force application point A and a force action point B.

Embossing element 8 is fixed to force action point B. Embossing element suspension system 21 is mounted rotatably about bearing L. Tensile and/or compressive forces can start at force application point A. These tensile and/or compressive forces can be applied via springs, actuators, motors etc.

FIG. 10b shows a diagrammatic line diagram of a second embossing element suspension system 21' according to the invention. Embossing element suspension system 21' is a carrier mounted rotatably about bearing L. The carrier has a force application point A and a force action point B.

Embossing element 8 is again fixed to force action point B. Tensile and/or compressive forces can start at force application point A. The tensile and/or compressive forces can be applied via springs, actuators, motors etc.

FIG. 10c shows a diagrammatic line diagram of a third embossing element suspension system 21" according to the invention. Embossing element suspension system 21" comprises a bearing L. A torque can be applied via bearing L. Embossing element 8 is again mounted at force action point B.

As a result of the application of a torque on the spiral, the latter contracts and raises point B in the vertical direction. A linear movement of point B can thus be brought about by a torque input and a force control can thus be indirectly brought about.

In the further descriptions of the figures, it is assume for the sake of simplicity that shown embossing element suspension system 21 is mass-less and the centre of gravity of the system is located in the centre of embossing element 8. The forces acting at force application point A can be generated by traction and/or compression elements.

FIG. 11a shows a diagrammatic representation of the use of first embossing element suspension system 21 according to the invention in a first position. Gravitational force $F_B$ acts on embossing element 8.

As a result of a counterforce $F_A$ acting at force application point A, embossing element suspension system 21 can be held in equilibrium.

FIG. 11b shows a diagrammatic representation of the use of first embossing element suspension system 21 in a second position. Gravitational force $F_B$ acts on embossing element 8. As a result of the removal of counterforce $F_A$ acting at force application point A, embossing element suspension system 21 can be lowered onto stamp 8 or carrier 17. Stamp 8 and/or carrier 17 is correspondingly deformed by corresponding gravitational force $F_B$. Resultant counterforce F acting according to the third Newtonian axiom has been shown in the diagrammatic representation.

FIG. 11c shows a diagrammatic representation of the use of first embossing element suspension system 21 in a third position. Gravitational force $F_B$ still acts on embossing element 8. As a result of a targeted application of force $F_A$ at force application point A, the resultant force acting on stamp 8 and/or carrier 17 can be influenced and controlled.

It is clear to the person skilled in the art that, by the application of a force in negative z-direction, the compressive force on stamp 8 and/or carrier 17 is reduced and, by the application of a force in positive z-direction, the compressive force on stamp 8 and/or carrier 17 is increased. Resultant counterforce F' acting according to the third Newtonian axiom has been shown in the diagrammatic representation. As a result of the application of force $F_{A'}$ acting in the negative z-direction at force application point A, the latter is correspondingly less than corresponding counterforce F from FIG. 14b.

Through the control of the force at force application point A, a very precise and simple control of the force acting on stamp 8 and/or carrier 17 is thus possible.

REFERENCE LIST

1 structured stamp
2 stamp face
2e nanostructures
2o embossing side
2u force-application side
3 holding fixture
4, 4' clamping bars
5 stamp system
6, 6' embossing material
6o embossing surface
6u rear side
7 substrate
8 embossing element
10 deformation curve
11 holding frame
12 spring
14 flat profile
15 flat profile 16 fixing means
17 carrier
18 lamp house
19 removal means
20 module
21, 21', 21'', 21''' embossing element suspension system
22 carriage
23 cross-beam
24, 24' apparatus
25 guide system
26 suspension
27 sample holder
28 connection layer
29 rotatably mounted cross-member
30 rail
31 embossed nanostructures
32 lifting system
33 coating
B embossing region
E surface plane
$F_A$, $F_{A'}$, $F_L$, $F_B$, F, F' forces
FR(t), FRH(t), FRV(t) forces
FS(u,t), FSH(u,t), FSV(u,t) forces
L bearing
PS, PR force action points
u coordinate
α release angle
β release angle Having described the invention, the following is claimed:

1. An apparatus for embossing micro- and/or nanostructures in an embossing material, said apparatus comprising:
   an embossing module, comprising:
      a structured stamp; and
      an embossing element comprising at least one roller, the embossing element being configured to remove the structured stamp from the embossing material in a targeted manner when the structured stamp is in contact with the embossing material and between the embossing element and the embossing material; and
   a cross-beam to which the embossing module is fixed and from which the embossing module is suspended, the cross-beam being configured to controllably move the embossing module to a position in a step-and-repeat process.

2. The apparatus according to claim 1, further comprising:
   a control device configured to control the embossing element to remove the structured stamp from the embossing material in the targeted manner when the structured stamp is in contact with the embossing material.

3. The apparatus according to claim 2, wherein the control device is further configured to control the cross-beam to controllably move the embossing module to the position in the step-and-repeat process to emboss the micro- and/or nanostructures with the structured stamp at multiple areas in the embossing material using the embossing element.

4. The apparatus according to claim 1, further comprising:
   at least one clamping bar configured to hold the structured stamp, said at least one clamping bar being controllably movable along a removal curve.

5. The apparatus according to claim 4, wherein the removal curve is defined by one of the following:
   a polynomial,
   a root function,
   a logarithmic function,
   a trigonometric function, or
   a step function.

6. The apparatus according to claim 5, wherein a graph of the polynomial is a straight line or parabola.

7. The apparatus according to the claim 5, wherein the trigonometric function is a sine function.

8. The apparatus according to claim 4, further comprising:
   a removal means for separating the structured stamp from the embossing material, said removal means including the embossing element and the at least one clamping bar.

9. The apparatus according to claim 8, wherein the removal means effects a linear movement of a side of the structured stamp.

10. The apparatus according to claim 9, wherein the removal means effects the linear movement of the side of the structured stamp in a direction normal to an embossing surface of said embossing material.

11. The apparatus according to claim 8, wherein the removal means comprises rods.

12. The apparatus according to claim 8, wherein the removal means comprises mounted linear elements.

13. The apparatus according to claim 8, wherein the removal means has a translational speed of between 0.1 mm/s and 100 mm/s.

14. The apparatus according to claim 8, wherein the removal means is connected to the structured stamp and/or to a carrier connected to the structured stamp.

15. The apparatus according to claim 8, wherein the removal means is connected to the at least one clamping bar for holding the structured stamp.

16. The apparatus according to claim 4, wherein the structured stamp is fixed by the at least one clamping bar, and
   wherein the at least one clamping bar is moveable perpendicular to an embossing surface of said embossing material and/or in a Z-direction.

17. The apparatus according to claim 4, wherein the structured stamp is fixed laterally by the at least one clamping bar.

18. The apparatus according to claim 4, further comprising:
   a lifting system for moving the at least one clamping bar.

19. The apparatus according to claim 4, wherein the at least one clamping bar is mounted rotatably.

20. The apparatus according to claim 4, wherein the at least one clamping bar is rotatable about a rotation axis which is arranged parallel to an embossing surface of the embossing material and/or perpendicular to the Z-direction and/or perpendicular to a movement direction of the embossing element and/or parallel to the Y-direction.

21. The apparatus according to claim 4, wherein the at least one clamping bar is movable in a first direction and a second direction.

22. The apparatus according to claim 21, wherein the at least one clamping bar is moveable simultaneously in the first and second directions.

23. The apparatus according to claim 21, wherein the second direction is the x-direction and/or parallel to the embossing surface and/or parallel to the movement direction of the embossing element.

24. The apparatus according to claim 1, wherein the structured stamp has a stamp face with micro- and/or nanostructures.

25. The apparatus according to claim 1, further comprising:
   an embossing element suspension system configured to suspend the embossing element from the cross-beam and fix the embossing element to the cross-beam such that a force acting on the structured stamp and/or a carrier connected to the structured stamp is adjustable by a counterforce in the targeted manner.

26. The apparatus according to claim 25, wherein the embossing element suspension system comprises a rotatably mounted rocker and/or the carrier and/or a spiral.

27. A removal means for removing a structured stamp from an embossing material for the apparatus according to claim 1, wherein the removal means is configured to effect a linear movement of a side of the structured stamp.

28. The removal means according to claim 27, wherein said linear movement is directed normal to an embossing surface of the embossing material.

29. An embossing element suspension system for suspending an embossing element of the apparatus according to claim 1, wherein the embossing element suspension system is configured to suspend the embossing element from the cross-beam and fix the embossing element to the cross-beam such that a force acting on the structured stamp and/or a carrier connected to the structured stamp is adjustable by a counterforce in the targeted manner.

30. A method for embossing micro- and/or nanostructures in an embossing material, said method comprising:
controllably moving an embossing element of an embossing module to remove a structured stamp of the embossing module from the embossing material in a targeted manner when the structured stamp is in contact with the embossing material and between the embossing element and the embossing material, the embossing element including at least one roller; and
controllably moving the embossing module to a position in a step-and-repeat process using a cross-beam to which the embossing module is fixed and from which the embossing module is suspended.

31. The method according to claim 30, wherein the cross-beam is controlled by a control device to controllably move the embossing module to the position in the step-and-repeat process to emboss the micro- and/or nanostructures with the structured stamp at multiple areas in the embossing material using the embossing element.

32. The method according to claim 30, wherein the controllably moving of the embossing element comprises:
moving at least one clamping bar holding the structured stamp along a removal curve.

33. The method according to claim 32, wherein the removal curve is defined by one of the following:
a polynomial,
a root function,
a logarithmic function,
a trigonometric function, or
a step function.

34. The method according to claim 33, wherein a graph of the polynomial is a straight line or parabola.

35. The method according to claim 33, wherein the trigonometric function is a sine function.

36. A stamp system, comprising:
an embossing module, comprising:
a structured stamp configured to emboss micro- and/or nanostructures in an embossing material;
a carrier on which the structured stamp is fixed; and
an embossing element comprising at least one roller, the embossing element being configured to remove the structured stamp from the embossing material in a targeted manner when the structured stamp is in contact with the embossing material and between the embossing element and the embossing material; and
a cross-beam to which the embossing module is fixed and from which the embossing module is suspended, the cross-beam being configured to controllably move the embossing module to a position in a step-and-repeat process,
wherein the structured stamp and the carrier are configured elastically such that the structured stamp and the carrier are deformable by the embossing element.

37. The stamp system according to claim 36, further comprising:
at least one clamping bar that is controllably moveable along a removal curve, the at least one clamping bar being configured to hold the structure stamp.

38. The stamp system according to claim 37, wherein the removal curve is defined by one of the following:
a polynomial,
a root function,
a logarithmic function,
a trigonometric function, or
a step function.

39. The stamp system according to claim 38, wherein a graph of the polynomial is a straight line or parabola.

40. The stamp system according the claim 38, wherein trigonometric function is a sine function.

41. The stamp system according to claim 36, wherein the structured stamp has a stamp face with micro- and/or nanostructures.

42. The stamp system according to claim 36, wherein the structured stamp is a soft stamp.

43. The stamp system according to claim 36, wherein the carrier comprises glass.

44. The stamp system according to claim 36, wherein the carrier is connected to the structured stamp in a planar manner.

* * * * *